(12) United States Patent
Knoedgen et al.

(10) Patent No.: US 10,469,065 B2
(45) Date of Patent: Nov. 5, 2019

(54) MULTI-LEVEL GATE CONTROL FOR TRANSISTOR DEVICES

(71) Applicant: Dialog Semiconductor (UK) Limited, London (GB)

(72) Inventors: Horst Knoedgen, Munich (DE); Christoph N. Nagl, Graz (AT); Nebojsa Jelaca, Graz (AT); Frank Kronmueller, Neudenau (DE); Ambreesh Bhattad, Swindon (GB)

(73) Assignee: Dialog Semiconductor (UK) Limited, London (GB)

(*) Notice: Subject to any disclaimer, the term of this patent is extended or adjusted under 35 U.S.C. 154(b) by 0 days.

(21) Appl. No.: 15/909,126

(22) Filed: Mar. 1, 2018

(65) Prior Publication Data

US 2019/0273487 A1 Sep. 5, 2019

(51) Int. Cl.

| | |
|---|---|
| *H03K 3/00* | (2006.01) |
| *H03K 17/687* | (2006.01) |
| *H02M 3/155* | (2006.01) |
| *H03K 17/06* | (2006.01) |
| *H03K 3/57* | (2006.01) |
| *H01L 29/778* | (2006.01) |

(52) U.S. Cl.
CPC ............. *H03K 17/063* (2013.01); *H03K 3/57* (2013.01); *H03K 17/687* (2013.01); *H01L 29/778* (2013.01)

(58) Field of Classification Search
CPC ...... H03K 17/063; H03K 17/687; H03K 3/57; H01L 29/778
See application file for complete search history.

(56) References Cited

U.S. PATENT DOCUMENTS 7,148,673 B2 * 12/2006 Sutardja ................. H02M 1/08
323/351

FOREIGN PATENT DOCUMENTS

WO    WO 00/19597    * 4/2000    ............... H03B 1/00

* cited by examiner

*Primary Examiner* — Kenneth B Wells
(74) *Attorney, Agent, or Firm* — Saile Ackerman LLC; Stephen B. Ackerman

(57) ABSTRACT

A circuit for operating a transistor device that acts as a switch is presented. The circuit includes the transistor device and a control circuit coupled to a gate of the transistor device. The control circuit is adapted to selectively apply at least a first voltage level, a second voltage level, and a third voltage level to the gate of the transistor device, wherein the first, second, and third voltage levels are distinct voltage levels. The disclosure further relates to a method of operating a transistor device that acts as a switch. The proposed circuit provides additional gate voltages, by contrast to conventional two-level gate drivers. By appropriate choice of the additional gate voltages, reverse mode conductance losses of the transistor device can be reduced and/or to the Safe Operating Area (SOA) of the transistor device can be improved.

26 Claims, 5 Drawing Sheets

MULTI-LEVEL GATE CONTROL FOR TRANSISTOR DEVICES

TECHNICAL FIELD

This disclosure relates to circuits for operating a transistor device acting as a switch and methods of operating a transistor device acting as a switch. This disclosure is particularly applicable to Gallium Nitride (GaN) transistor devices, such as GaN High Electron Mobility Transistors (HEMTs).

BACKGROUND

Conventionally, two gate voltage levels are used for operating (driving) power switches, i.e., low for OFF and high for ON. For many transistor devices that can act as power switches, a parasitic body diode exists which allows a PN-type Reverse Conduction Mode (RCM) when the device is turned off by gate control. Depending on the transistor device, also a usable reverse conduction mode may exist. This mode might be overlaid by the PN conduction mode.

For GaN transistor devices there generally is no body diode. However, GaN HEMTs have a reverse conduction mode. Moreover, the safe operating area (SOA) of a GaN HEMT depends on the drain-source voltage and the gate voltage of the device. This poses the following two problems.

Firstly, when the transistor device is in reverse conduction mode and the reverse $V_{DS}$ voltage is large, power dissipation losses will be high. This is clearly undesirable from a viewpoint of power conservation and efficiency.

Secondly, having a large $V_{DS}$ voltage and therefore a large device current when turning on the transistor device might violate the SOA. For example, circuits with long transition time for turning on the power device are likely to violate the SOA.

SUMMARY

Thus, there is a need for circuits for operating a transistor device acting as a switch that allow the reduction of reverse mode conductance losses and/or to improve the SOA of the transistor device. There is a further need for methods of operating a transistor device acting as a switch that allow to reduce reverse mode conductance losses and/or to improve the SOA of the transistor device.

In view of some or all of these needs, the present disclosure proposes a circuit for operating a transistor device that acts as a switch and a method of operating a transistor device that acts as a switch, having the features of the respective independent claims.

An aspect of the disclosure relates to a circuit for operating (e.g., driving) a transistor device that acts as a switch (e.g., transistor switch, power switch). The circuit may include the transistor device. The circuit may further include a control circuit (e.g., gate voltage control circuit) coupled to a gate (e.g., gate terminal) of the transistor device. The control circuit may be adapted to selectively apply at least a first voltage level, a second voltage level, and a third voltage level to the gate of the transistor device. The first, second, and third voltage levels may be distinct voltage levels. That is, the first, second, and third voltage levels may be pairwise different (different in pairs).

Configured as such, the proposed circuit provides additional gate voltages, by contrast to conventional two-level gate drivers. By appropriate choice of the additional gate voltages, reverse mode conductance losses of the transistor device can be reduced and/or the SOA of the transistor device can be improved. For example, by using a reduced gate voltage during the turn-on phase of the transistor device, the maximum current capability of the transistor device during the turn-on phase can be reduced. This reduced gate voltage can be applied a priori, for example if an SOA violation is anticipated due to system characteristics. After a critical SOA phase, the gate voltage can be changed back to the transistor device's default (nominal) drive voltage (e.g., 6 V). As another example, by applying a positive bias voltage below the threshold voltage as the gate voltage, the reverse drain-source voltage drop can be reduced. Accordingly, a low reverse-mode voltage similar to typical MOS behavior with body diode can be achieved, thereby reducing reverse mode conduction losses. The aforementioned measures allow the downsizing of the transistor device for a given set of SOA specifications and to use the transistor device more efficiently, and/or to achieve a higher voltage range for the transistor device, e.g., when acting as a power device. Further, non-overlap control when turning ON the transistor device in half-bridge configurations can be relaxed. Yet further, a better on-state resistance $R_{DS\_ON}$ can be achieved for transistor devices that are operated by the proposed circuit.

In some embodiments, the first voltage level may be chosen such that a gate-source voltage $V_{GS}$ of the transistor device is (substantially) zero or negative when the first voltage level is applied to the gate of the transistor device. The first voltage level may be smaller than zero to achieve this aim. The second voltage level may be chosen such that the transistor device is fully conducting (fully ON) when the second voltage level is applied to the gate of the transistor device. The second voltage level may be the maximum gate drive ON voltage of the transistor device (e.g., chosen so as to yield maximum performance of the transistor device). The second voltage level may be modulated depending on load and/or process and/or temperature, e.g., to achieve best performance. By providing additional gate (drive) voltage levels for the transistor device in addition to these first and second voltage levels, the SOA can be improved, and/or reverse conduction losses can be reduced, as indicated above.

In some embodiments, the third voltage level may be an intermediate voltage level between the first and second voltage levels. By choosing the third voltage level between the first voltage level and the second voltage level, the SOA can be improved, and/or reverse conduction losses can be reduced, as indicated above.

In some embodiments, the third voltage level may be chosen such that high voltage reverse conductance of the transistor device is reduced when the third voltage level is applied to the gate of the transistor device. That is, the third voltage level may be chosen so as to reduce the reverse conductance drain-source voltage of the transistor device, e.g., to a few hundred mV. By reducing the reverse conductance drain-source voltage of the transistor device, especially while the reverse mode current is large, reverse mode conductance losses of the transistor device can be reduced.

For example, the third voltage level may be chosen such that the gate-source voltage of the transistor device is smaller than a threshold voltage of the transistor device, when the third voltage level is applied to the gate of the transistor device. For example, the third voltage level may be chosen such that the gate-source voltage of the transistor device is smaller than the threshold voltage of the transistor device by a predetermined amount (e.g., by approximately 5% to 10%), when the third voltage level is applied to the gate of the transistor device. The predetermined amount may be modulated as a function of load and/or process and/or temperature, for example. That is, the predetermined amount may depend on the load and/or process and/or temperature, for example.

In some embodiments, the third voltage level may be alternatively chosen such that the transistor device operates within its safe operation area, SOA, at a given drain-source voltage of the transistor device, when the third voltage level is applied to the gate of the transistor device.

For example, the third voltage level may be chosen between the first and second voltage levels such that the gate-source voltage of the transistor device is larger than the threshold voltage of the transistor device, when the third voltage level is applied to the gate of the transistor device.

In some embodiments, the control circuit may be adapted to apply the first, second, and third voltage levels such that a gate voltage of the transistor device changes from the first voltage level to the third voltage level and from the third voltage level to the second voltage level. The control circuit may be further adapted to apply the second voltage level a predetermined period of time after the third voltage level has been applied. That is, the third voltage level may be applied for a duration that substantially equals the predetermined period of time.

In some embodiments, the control circuit may be adapted to apply the first, second, and third voltage levels such that a gate voltage of the transistor device changes from the first voltage level to the third voltage level and from the third voltage level to the second voltage level. The control circuit may be further adapted to apply the second voltage level when, after the third voltage level has been applied, a drain-source voltage of the transistor device has dropped by a predetermined amount (or to a predetermined level).

By waiting for a predetermined period of time before applying the second voltage level, i.e., before fully turning ON the transistor device, or by waiting until the drain-source voltage of the transistor device has sufficiently dropped, a situation can be avoided in which an initially high drain-source voltage of the transistor device would lead to a SOA violation if the transistor device were turned fully ON.

In some embodiments, the control circuit may be further adapted to apply a fourth voltage level to the gate of the transistor device. The first, second, third, and fourth voltage levels may be distinct voltage levels. Thereby, both an improvement of SOA and a reduction of reverse mode conduction losses can be achieved.

In some embodiments, the third and fourth voltage levels may be intermediate voltage levels between the first and second voltage levels. By choosing the third and fourth voltage levels between the first voltage level and the second voltage level, the SOA can be improved, and reverse conduction losses can be reduced, as indicated above.

In some embodiments, the third voltage level may be chosen such that high voltage reverse conductance of the transistor device is reduced when the third voltage level is applied to the gate of the transistor device. The fourth voltage level may be chosen such that the transistor device operates within its safe operation area, SOA, at a given drain-source voltage of the transistor device, when the fourth voltage level is applied to the gate of the transistor device.

In some embodiments, the transistor device may be a Gallium Nitride, GaN, transistor or a Metal Oxide Semiconductor, MOS, transistor. For example, the transistor device may be a GaN HEMT. Since GaN transistor devices do not have a body diode and are susceptible to SOA violation, the proposed circuit can be advantageously applied to such transistor devices.

In some embodiments, the control circuit may include a first switch coupled between the first voltage level and the gate of the transistor device. The first switch may be a transistor switch, for example. The first switch may be said to form a pull-down circuit, and the first voltage level may be said to be a pull-down voltage. The control circuit may further include a second switch coupled between the second voltage level and the gate of the transistor device. The second switch may be a transistor switch, for example. The second switch may be said to form a pull-up circuit, and the second voltage level may be said to be a pull-up voltage. The control circuit may further include a third switch coupled between the third voltage level and the gate of the transistor device. The control circuit may be adapted to switch any one of the first, second, and third switches to an on-state, while keeping the other switches in an off-state. Thereby, a control circuit capable of selectively applying the first to third voltage levels can be implemented in a simple and efficient manner.

In some embodiments, the control circuit may include a first switch coupled between the first voltage level and the gate of the transistor device. The first switch may be a transistor switch, for example. The first switch may be said to form a pull-down circuit, and the first voltage level may be said to be a pull-down voltage. The control circuit may further include a second switch coupled between the second voltage level and the gate of the transistor device. The second switch may be a transistor switch, for example. The second switch may be said to form a pull-up circuit, and the second voltage level may be said to be a pull-up voltage. The control circuit may further include a third switch coupled between the third voltage level and the gate of the transistor device. The control circuit may yet further include a fourth switch coupled between the fourth voltage level and the gate of the transistor device. The control circuit may be adapted to switch any one of the first, second, third, and fourth switches to an on-state, while keeping the other switches in an off-state. Thereby, a control circuit capable of selectively applying the first to fourth voltage levels can be implemented in a simple and efficient manner.

Another aspect of the disclosure relates to a method of operating (e.g., driving) a transistor device that acts as a switch (e.g., transistor switch, power switch). The method may include selectively applying at least a first voltage level, a second voltage level, and a third voltage level to a gate (e.g., gate terminal) of the transistor device. The first, second, and third voltage levels may be distinct voltage levels. That is, the first, second, and third voltage levels may be pairwise different (different in pairs).

In some embodiments, the first voltage level may be chosen such that a gate-source voltage $V_{GS}$ of the transistor device is (substantially) zero or negative when the first voltage level is applied to the gate of the transistor device. The first voltage level may be smaller than zero to achieve this aim. The second voltage level may be chosen such that the transistor device is fully conducting (fully ON) when the second voltage level is applied to the gate of the transistor device. The second voltage level may be the maximum gate drive ON voltage of the transistor device (e.g., chosen so as to yield maximum performance of the transistor device). The second voltage level may be modulated depending on load and/or process and/or temperature, e.g., to achieve best performance.

In some embodiments, the third voltage level may be an intermediate voltage level between the first and second voltage levels.

In some embodiments, the third voltage level may be chosen such that high voltage reverse conductance of the transistor device is reduced when the third voltage level is applied to the gate of the transistor device. That is, the third voltage level may be chosen so as to reduce the reverse conductance drain-source voltage of the transistor device, e.g., to a few hundred mV.

For example, the third voltage level may be chosen such that the gate-source voltage of the transistor device is smaller than a threshold voltage of the transistor device, when the third voltage level is applied to the gate of the transistor device. For example, the third voltage level may be chosen such that the gate-source voltage of the transistor device is smaller than the threshold voltage of the transistor device by a predetermined amount (e.g., by approximately 5% to 10%), when the third voltage level is applied to the gate of the transistor device. The predetermined amount may be modulated as a function of load and/or process and/or temperature, for example. That is, the predetermined amount may depend on the load and/or process and/or temperature, for example.

In some embodiments, the third voltage level may be alternatively chosen such that the transistor device operates within its safe operation area, SOA, at a given drain-source voltage of the transistor device, when the third voltage level is applied to the gate of the transistor device. For example, the third voltage level may be chosen between the first and second voltage levels such that the gate-source voltage of the transistor device is larger than the threshold voltage of the transistor device, when the third voltage level is applied to the gate of the transistor device.

In some embodiments, the method may include applying the first, second, and third voltage levels such that a gate voltage of the transistor device changes from the first voltage level to the third voltage level and from the third voltage level to the second voltage level. The method may further include applying the second voltage level a predetermined period of time after the third voltage level has been applied. That is, the third voltage level may be applied for a duration that substantially equals the predetermined period of time.

In some embodiments, the method may include applying the first, second, and third voltage levels such that a gate voltage of the transistor device changes from the first voltage level to the third voltage level and from the third voltage level to the second voltage level. The method may further include applying the second voltage level when, after the third voltage level has been applied, a drain-source voltage of the transistor device has dropped by a predetermined amount (or to a predetermined level).

In some embodiments, the method may further include applying a fourth voltage level to the gate of the transistor device. The first, second, third, and fourth voltage levels may be distinct voltage levels.

In some embodiments, the third and fourth voltage levels may be intermediate voltage levels between the first and second voltage levels.

In some embodiments, the third voltage level may be chosen such that high voltage reverse conductance of the transistor device is reduced when the third voltage level is applied to the gate of the transistor device. The fourth voltage level may be chosen such that the transistor device operates within its safe operation area, SOA, at a given drain-source voltage of the transistor device, when the fourth voltage level is applied to the gate of the transistor device.

In some embodiments, the transistor device may be a Gallium Nitride, GaN, transistor or a Metal Oxide Semiconductor, MOS, transistor. For example, the transistor device may be a GaN HEMT.

In some embodiments, the method may include providing a first switch coupled between the first voltage level and the gate of the transistor device. The first switch may be a transistor switch, for example. The first switch may be said to form a pull-down circuit, and the first voltage level may be said to be a pull-down voltage. The method may further include providing a second switch coupled between the second voltage level and the gate of the transistor device. The second switch may be a transistor switch, for example. The second switch may be said to form a pull-up circuit, and the second voltage level may be said to be a pull-up voltage. The method may further include providing a third switch coupled between the third voltage level and the gate of the transistor device. The method may yet further include switching any one of the first, second, and third switches to an on-state, while keeping the other switches in an off-state.

In some embodiments, the method may further include providing a first switch coupled between the first voltage level and the gate of the transistor device. The first switch may be a transistor switch, for example. The first switch may be said to form a pull-down circuit, and the first voltage level may be said to be a pull-down voltage. The method may further include providing a second switch coupled between the second voltage level and the gate of the transistor device. The second switch may be a transistor switch, for example. The second switch may be said to form a pull-up circuit, and the second voltage level may be said to be a pull-up voltage. The method may further include providing a third switch coupled between the third voltage level and the gate of the transistor device. The method may further include providing a fourth switch coupled between the fourth voltage level and the gate of the transistor device. The method may yet further include switching any one of the first, second, third, and fourth switches to an on-state, while keeping the other switches in an off-state.

Notably, the method may be applied to any of the circuits described above, for example as a method of operating these circuits. In addition to steps for operating these circuits, the method may further include steps for providing or arranging any, some, or all of the elements of these circuits and/or steps for coupling or connecting respective elements of these circuits.

Moreover, it will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner (e.g., indirectly). Notably, one example of being coupled is being connected.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates an example of a circuit for operating a transistor device according to embodiments of the disclosure.

DESCRIPTION

As indicated above, identical or like reference numbers in the disclosure indicate identical or like elements, and repeated description thereof may be omitted for reasons of conciseness.

Figure 1:
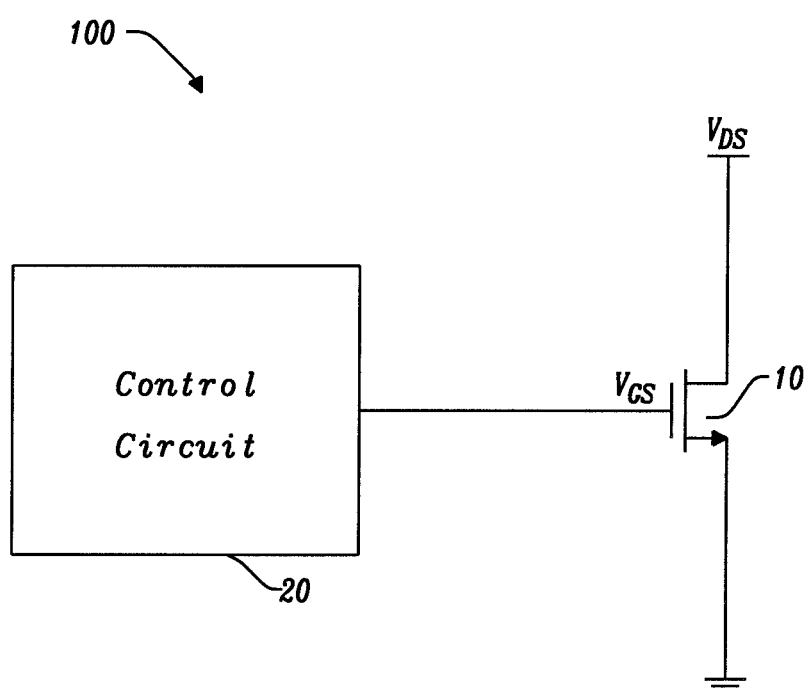

FIG. 1 shows an example of a circuit 100 for operating (e.g., driving) a transistor device 10. The transistor device 10 may act as a switch (transistor switch). For example, the transistor device 10 may act as a power switch. Further, the transistor device may be a GaN transistor, for example, or a MOS transistor. For example, the transistor device 10 may be a GaN HEMT. The circuit 100 comprises the transistor device 10, as well as a control circuit 20 that is coupled to a gate (gate terminal) of the transistor device 10. By applying a voltage level to the gate of the transistor device 10, the control circuit 20 can control the gate-source voltage $V_{GS}$ between the gate of the transistor device 10 and a source (source terminal) of the transistor device 10. Hence, the control circuit 20 may be referred to as a gate voltage control circuit, or gate control circuit. In the example of FIG. 1, the source of the transistor device 10 is illustrated to be grounded, without intended limitation.

The control circuit 20 is adapted (configured) to selectively apply at least a first voltage level, a second voltage level, and a third voltage level to the gate of the transistor device 10. For example, the control circuit 20 may be adapted to selectively apply the first voltage level, the second voltage level, and the third voltage level, to the gate of the transistor device 10. As will be described below, the control circuit 20 may be also adapted to selectively apply the first voltage level, the second voltage level, the third voltage level, and a fourth voltage level, to the gate of the transistor device 10. Therein, the first, second, and third voltage levels (and, where applicable, the fourth voltage level) are distinct voltage levels. That is, the first, second, and third voltage levels (and, where applicable, the fourth voltage level) are different in pairs (pairwise different).

The first voltage level corresponds to the off-state of the transistor device 10. That is, the first voltage level may be chosen such that a gate-source voltage $V_{GS}$ of the transistor device 10 is substantially zero (or negative) when the first voltage level is applied to the gate of the transistor device 10. To this end, the first voltage level may be smaller than zero. The second voltage level corresponds to the on-state (fully on-state) of the transistor device 10. That is, the second voltage level may be chosen such that the transistor device 10 is fully conducting when the second voltage level is applied to the gate of the transistor device 10. The second voltage level may be the maximum gate drive ON voltage of the transistor device 10 (e.g., chosen so as to yield maximum performance of the transistor device 10).

The third voltage level is an intermediate voltage level between the first voltage level and the second voltage level. Likewise, where applicable, the fourth voltage level is an intermediate voltage level between the first voltage level and the second voltage level. In other words, the third and fourth voltage levels are above the first voltage level and below the second voltage level. Accordingly, the gate-source voltages $V_{GS}$ of the transistor device 10 when the third and fourth voltage levels are applied to the gate of the transistor device 10 are higher than zero and smaller than the maximum gate drive ON voltage of the transistor device 10.

Advantages of the control circuit's 20 ability to apply the third voltage level (and where applicable, the fourth voltage level) to the gate of the transistor device 10 will now be explained with reference to FIG. 2 and FIG. 3.

Generally, the SOA of a transistor device (e.g., power transistor) depends on the current limit $I_{D,max}$ for the drain current, the voltage limit $V_{DS,max}$ for the drain-source voltage, and on the power dissipation limit $P_{max}$. The operating point of the transistor device depends on the gate voltage and the resulting on-state resistance $R_{DS,ON}$ of the transistor device.

To avoid operation of the transistor device out of the SOA at high drain-source currents, it is proposed to turn ON the transistor device with a lower gate voltage (than the maximum gate drive ON voltage of the transistor device) in case of high drain-source voltages. As soon as the transistor device has reached a lower drain-source voltage, the gate voltage can be increased (e.g., up to the maximum gate drive ON voltage) for a better (lower) on-state resistance $R_{DS,ON}$ of the transistor device.

Figure 2:
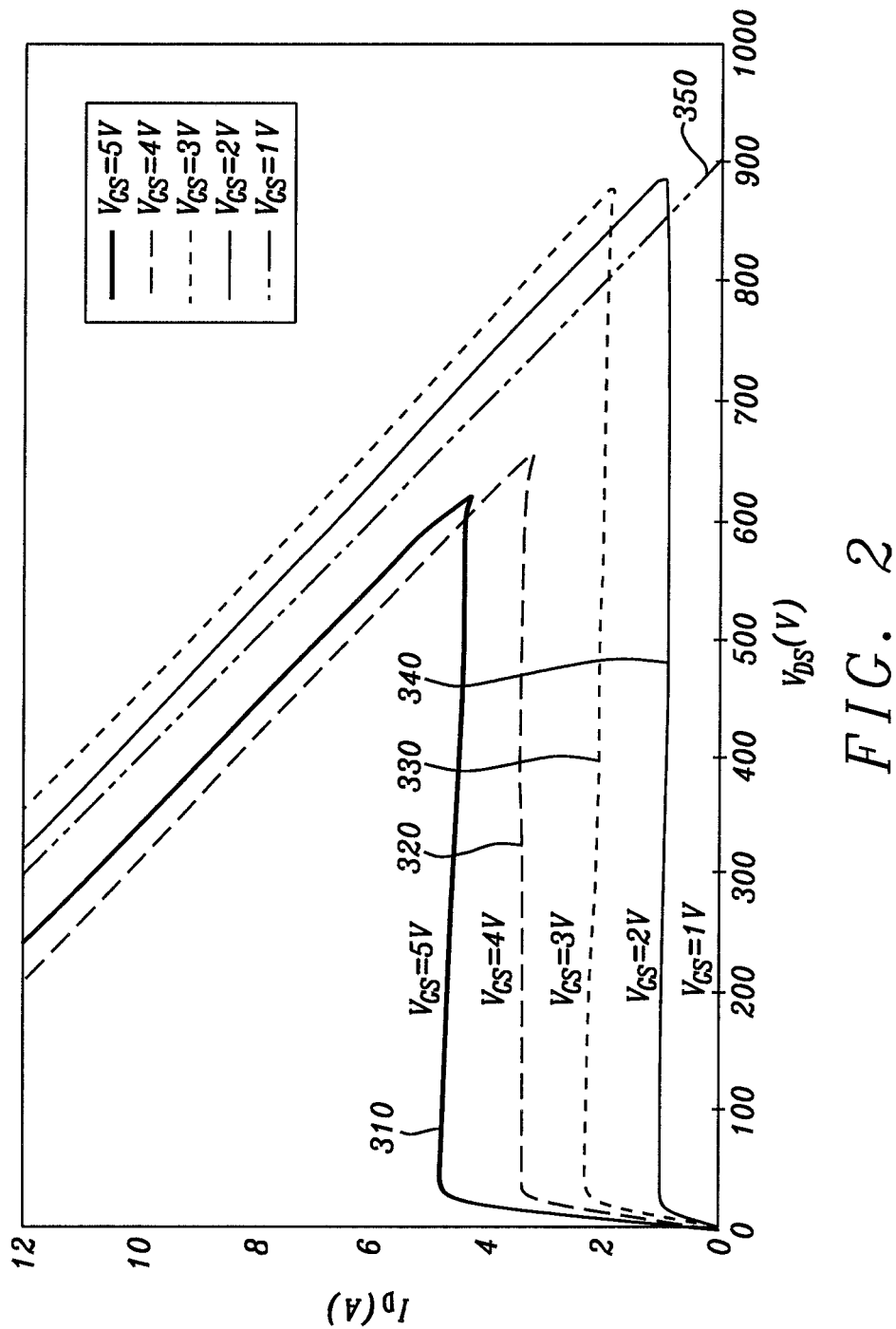
FIG. 2 is a diagram schematically illustrating examples of the SOA and breakdown voltages of a transistor device at different gate-source voltages.

FIG. 2 schematically illustrates examples of the SOA and breakdown voltages of a transistor device (a GaN HEMT in this example) at different gate-source voltages. Curves 310, 320, 330, 340, and 350 illustrate the relationship between the drain-source voltage $V_{DS}$ (e.g., $V_d$ for grounded source; horizontal axis) and the drain current $I_D$ (vertical axis) at values of the gate-source voltage $V_{GS}$ (e.g., gate voltage $V_g$ for grounded source) of 5V, 4V, 3V, 2V, and 1V, respectively. Respective bends at high drain-source voltages indicate breakdown of the transistor device. As can be seen from this diagram, higher drain-source voltages can be tolerated for lower gate-source voltages.

In accordance with this characteristic of transistor devices, the present disclosure proposes selective application of the third voltage level to the gate of the transistor device, in addition to the first voltage level (off-state) and the second voltage level (fully on-state). For this case, the third voltage level is chosen as an intermediate voltage level $V_{SOA}$ between the first and second voltage levels, such that the transistor device operates within its safe operation area, SOA, at a given drain-source voltage of the transistor device, when the third voltage level is applied to the gate of the transistor device. That is, the third voltage level may be predetermined in accordance with known drain-source voltage that may occur when the transistor device should be turned ON. In some embodiments, the third voltage level may be chosen between the first and second voltage levels such that the gate-source voltage of the transistor device is larger than the threshold voltage of the transistor device, when the third voltage level is applied to the gate of the transistor device.

As indicated above, the voltage at the gate of the transistor device may be changed from the third voltage level to the second voltage level after the drain-source voltage of the transistor device has dropped from its initial (high) value. Thus, a process of turning ON the transistor device may proceed as follows: According to embodiments of the disclosure, the process of turning ON the transistor device may involve successively applying the first, third, and second voltage levels, in this order, to the gate of the transistor device. Accordingly, a gate voltage of the transistor device changes from the first voltage level to the third voltage level and from the third voltage level to the second voltage level. Therein, the second voltage level may be applied to the gate of the transistor device a predetermined period of time after the third voltage level has been applied. Alternatively, the second voltage level may be applied to the gate of the transistor device when, after the third voltage level has been applied, a drain-source voltage of the transistor device has dropped by a predetermined amount or to a predetermined level.

Further to the above, some transistor devices (such as GaN transistor devices, for example) do not have a reverse diode (body diode) and the reverse voltage (reverse conduction voltage) depends on the threshold voltage $V_{th}$ of the transistor device and its transconductance $g_m$. Assuming for example a threshold voltage $V_{th}$ of 1.5 V and a gate drive voltage of 0 V, the transistor device starts conducting at −1.5 V in reverse conduction mode. If the gate-source voltage level is increased closer to the nominal threshold voltage $V_{th}$ (e.g., to 1 V), then the transistor device starts conducting in reverse mode at −0.5 V Consequently, the characteristic of the reverse conduction mode can be altered by applying different gate voltages to the transistor device (e.g., GaN transistor device, such as a GaN HEMT).

Figure 3:
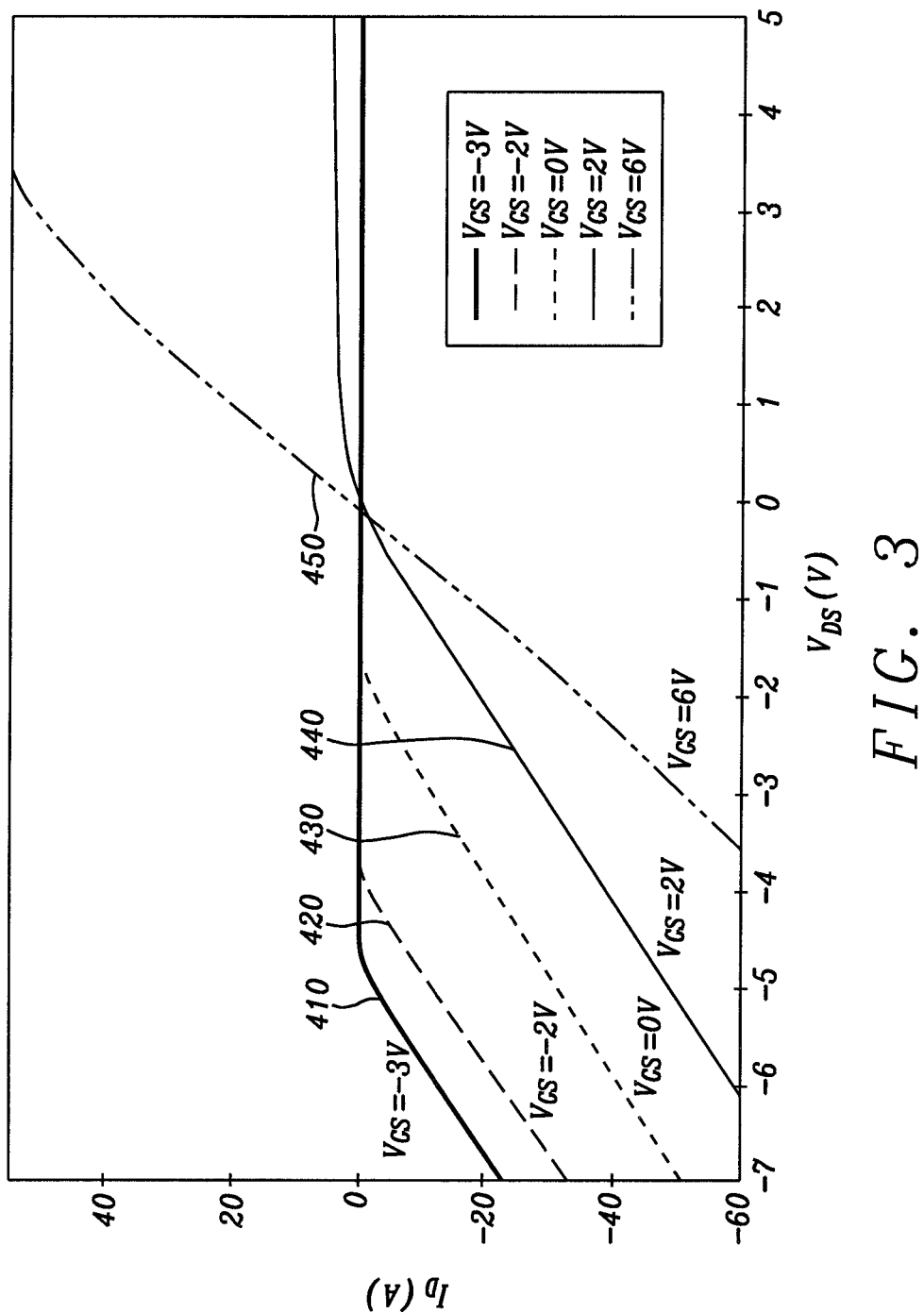
FIG. 3 is a diagram schematically illustrating examples of drain current vs. drain-source voltage curves of a transistor device for different gate-source voltages, FIG. 4 schematically illustrates another example of a circuit for operating a transistor device according to embodiments of the disclosure.

This is illustrated in FIG. 3 which schematically shows examples of drain current vs. drain-source voltage curves 410, 420, 430, 440, and 450 of a transistor device (a GaN HEMT in this example) for different gate-source voltages of −3 V, −2 V, 0 V, 2 V, and 6 V, respectively. Normal characteristic (forward conduction mode) is indicated by the upper arrow and the reverse conduction mode is indicated by the lower arrow. As can be seen from these curves, the characteristic of the reverse conduction mode can be modified by different gate voltages. Assuming for example a threshold voltage $V_{th}$ of 1.5 V and a gate-source voltage $V_{GS}$ of 1.5 V, the transistor device starts conducting at 0 V at the drain. The reverse mode characteristic is similar to the behavior of an adjustable Zener diode.

In accordance with this characteristic of transistor devices, the present disclosure proposes selective application of the third voltage level to the gate of the transistor device, in addition to the first voltage level (off-state) and the second voltage level (fully on-state). For this use case, the third voltage level is chosen as an intermediate voltage level $V_{reverse}$ between the first and second voltage levels, such that high voltage reverse conductance of the transistor device is reduced when the third voltage level is applied to the gate of the transistor device. To this end, the third voltage level may be chosen, between the first and second voltage levels, such that the gate-source voltage of the transistor device is smaller than a threshold voltage of the transistor device, when the third voltage level is applied to the gate of the transistor device. For example, the third voltage level may be chosen between the first and second voltage levels such that the gate-source voltage of the transistor device is smaller than the threshold voltage of the transistor device by a predetermined amount (e.g., by (approximately) 5% to 10%), when the third voltage level is applied to the gate of the transistor device. The predetermined amount may be modulated as a function of load and/or process and/or temperature, for example. That is, the predetermined amount may depend on the load and/or process and/or temperature, for example.

A process of turning ON the transistor device may proceed as follows: According to embodiments of the disclosure, the process of turning ON the transistor device may involve successively applying the first, third, and second voltage levels, in this order, to the gate of the transistor device. Thus, a gate voltage of the transistor device changes from the first voltage level to the third voltage level and from the third voltage level to the second voltage level. Therein, the second voltage level may be applied to the gate of the transistor device a predetermined period of time after the third voltage level has been applied. For example, the third voltage level may be applied as long as reverse conduction losses should be reduced.

In some embodiments, as indicated above, the control circuit may be adapted to apply both the third voltage level and the fourth voltage level, as intermediate voltage levels between the first voltage level (OFF) and the second voltage level (fully ON). In this case, one of the third and fourth voltage levels is chosen such that high voltage reverse conductance of the transistor device is reduced when that one voltage level is applied to the gate of the transistor device, and the other of the third and fourth voltage levels is chosen such that the transistor device operates within its safe operation area, SOA, at a given drain-source voltage of the transistor device, when that other voltage level is applied to the gate of the transistor device.

In summary, the present disclosure proposes to improve control of a transistor device (such as a GaN transistor, e.g., a GaN HEMT) by using at least three (e.g., three or four) voltage levels as gate voltages for the transistor device. Advantageous choices of these voltage levels are summarized in Table 1 below.

TABLE 1

| Mode | $V_{GS}$ | Description |
|---|---|---|
| OFF | $V_{OFF}$, 0 V | transistor device completely turned OFF (this might require negative voltage) |
| RCM | $V_{reverse}$ | Reduced Reverse Conduction Mode (RCM) gate drive OFF voltage ($0 < V_{reverse} < V_{th}$) |
| SOA ON | $V_{SOA}$ | Reduced gate drive ON voltage for improved SOA turn-on |
| TURN ON | $V_{ON}$ | Maximum gate drive ON voltage with maximum performance (e.g., 6 V or above) |

Figure 4:
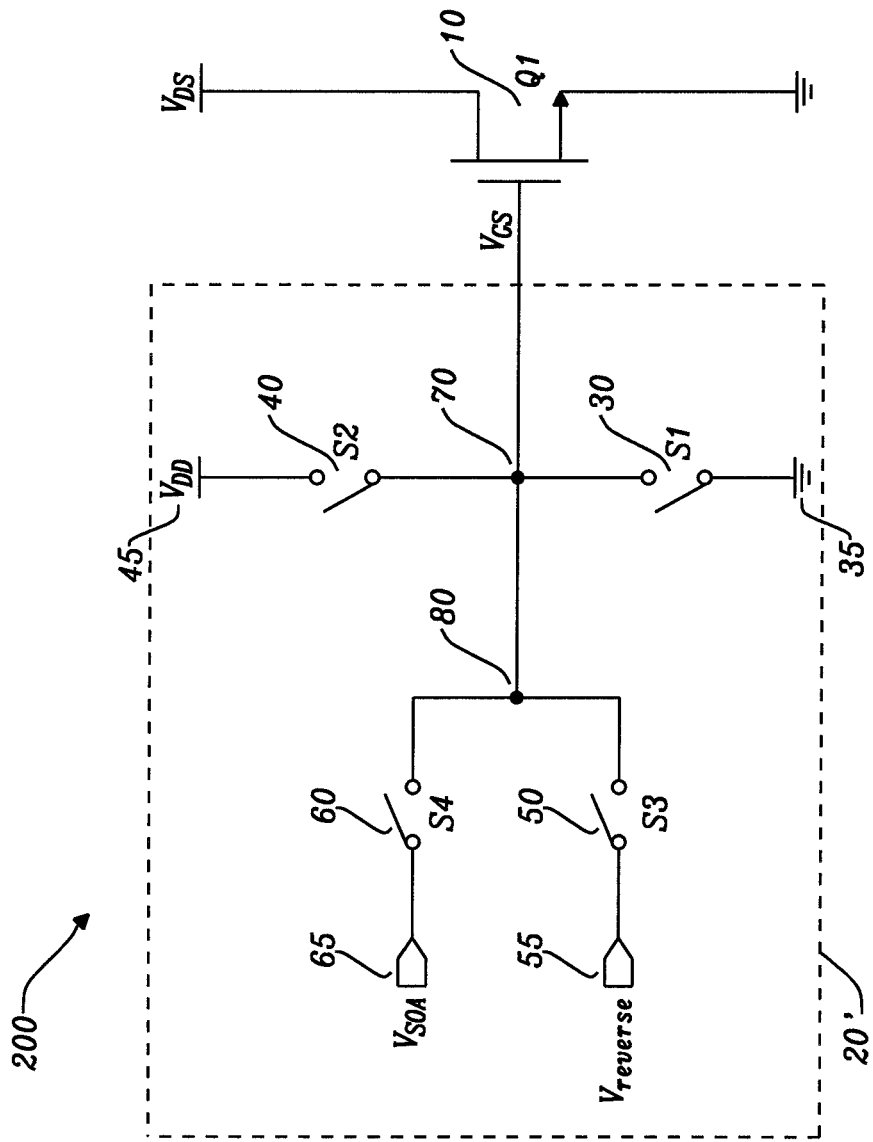

FIG. 4 schematically illustrates a specific, non-limiting example of a circuit 200 for operating a transistor device according to embodiments of the disclosure. This circuit 200 comprises the transistor device 10 and a control circuit 20' as a basic circuit for applying the first to fourth voltage levels to the gate of the transistor device 10. To be able to supply the gate with four different voltages, the control circuit 20' comprises a first switch (switching device) 30 coupled between the first voltage level 35 and the gate of the transistor device 10, a second switch (switching device) 40 coupled between the second voltage level 45 and the gate of the transistor device 10, a third switch (switching device) 50 coupled between the third voltage level 55 and the gate of the transistor device 10, and a fourth switch (switching device) 60 coupled between the fourth voltage level 65 and the gate of the transistor device 10. The first and second switches 30, 40 may be coupled to the gate of the transistor device via a first intermediate node 70. The third and fourth switches 50, 60 may be coupled to the gate of the transistor device via a second intermediate node 80. The first switch 30 and/or second switch 40 may be transistor switches, for example. In some implementations, any or all of the first, second, third, and fourth switches 30, 40, 50, 60 may be transistor switches.

In the example of FIG. 4, the first voltage level 35 corresponds to the off-state of the transistor device and the second voltage level 45 corresponds to the (fully) on-state of the transistor device. In the example, the first voltage level 35 is assumed to be ground. The third voltage level 55 is the voltage $V_{reverse}$ described above and the fourth voltage level 65 is the voltage $V_{SOA}$ described above.

To selectively apply the first to fourth voltage levels to the gate of the transistor device 10, the control circuit 20' is adapted (e.g., via logic circuitry, or the like, not shown in the figure) to switch any one of the first, second, third, and fourth switches 30, 40, 50, 60 to an on-state, while keeping the other switches in an off-state. In case that the control circuit 20' is adapted to selectively apply the first to third voltage levels (only), the fourth switch 60 may be omitted. In this case, the third voltage level may be any of the voltage $V_{reverse}$ and the voltage $V_{SOA}$ described above, for example.

As noted above, FIG. 4 gives the basic circuit which can supply the gate with four different voltage levels. Applying a multi-level gate voltage, the transistor is operated in the best and/or safest operating condition. In this configuration, the first switch 30 may be said to form a pull-down circuit or pull-down device, and the first voltage level 35 may be said to be a pull-down voltage. Further, the second switch 40 may be said to form a pull-up circuit or pull-up device, and the second voltage level 45 may be said to be a pull-up voltage. The third and fourth switches 50, 60 are used to apply the additional gate voltage levels $V_{SOA}$ and $V_{reverse}$ to the gate of the transistor device 10.

Figure 5:
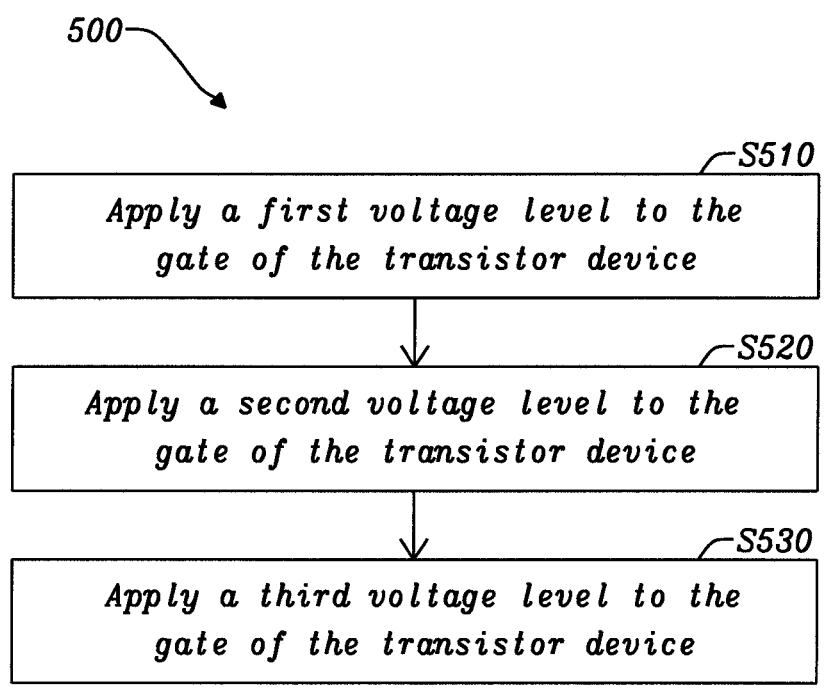
FIG. 5 is a flowchart schematically illustrating a method of operating a transistor device according to embodiments of the disclosure.

FIG. 5 is a flowchart schematically illustrating a method 500 of operating a transistor device according to embodiments of the disclosure. For example, the method 500 may be used to turn ON the transistor device. At step S510, the first voltage level is applied to a gate of the transistor device. The first voltage level may correspond to the off-state of the transistor device. At step S520, the third voltage level is applied to the gate of the transistor device. The third voltage level may be either the voltage $V_{reverse}$ or the voltage $V_{SOA}$ described above, for example. At step S530, the second voltage level is applied to the gate of the transistor device. The second voltage level may correspond to the (fully) on-state of the transistor device. The method 500 may proceed from step S520 to step S530 after a predetermined period of time has elapsed, or after a drain-source voltage of the transistor device has dropped by a predetermined amount (or to a predetermined level).

In some embodiments, method 500 may comprise a further step (not shown) of applying the fourth voltage level to the gate of the transistor device. The fourth voltage level may be the other one of the voltage $V_{reverse}$ and the voltage $V_{SOA}$ described above, for example.

It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above, and/or to providing or arranging respective elements of theses circuits.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiments outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A circuit for operating a transistor device that acts as a switch, the circuit comprising:
   the transistor device; and
   a control circuit coupled to a gate of the transistor device,
   wherein the control circuit is adapted to selectively apply at least a first voltage level, a second voltage level, and a third voltage level to the gate of the transistor device,
   wherein the first, second, and third voltage levels are distinct voltage levels,
   wherein the first voltage level is chosen such that a gate-source voltage of the transistor device is substantially zero or negative when the first voltage level is applied to the gate of the transistor device;
   wherein the second voltage level is chosen such that the transistor device is fully conducting when the second voltage level is applied to the gate of the transistor device; and
   wherein the third voltage level is chosen such that the gate-source voltage of the transistor device is smaller than a threshold voltage of the transistor device, when the third voltage level is applied to the gate of the transistor device, wherein the threshold voltage is a turn-on threshold voltage for the gate-source voltage at which the transistor device starts conducting.

2. The circuit according to claim 1, wherein the third voltage level is an intermediate voltage level between the first and second voltage levels.

3. The circuit according to claim 1, wherein the third voltage level is chosen such that the gate-source voltage of the transistor device is smaller than the threshold voltage of the transistor device by a predetermined amount, when the third voltage level is applied to the gate of the transistor device.

4. The circuit according to claim 1, wherein the third voltage level is chosen such that the transistor device operates within its safe operation area, SOA, at a given drain-source voltage of the transistor device, when the third voltage level is applied to the gate of the transistor device.

5. The circuit according to claim 4, wherein the third voltage level is chosen between the first and second voltage levels such that the gate-source voltage of the transistor device is larger than the threshold voltage of the transistor device, when the third voltage level is applied to the gate of the transistor device.

6. The circuit according to claim 1,
   wherein the control circuit is adapted to:

apply the first, second, and third voltage levels such that a gate voltage of the transistor device changes from the first voltage level to the third voltage level to the second voltage level; and apply the second voltage level when, after the third voltage level has been applied, a drain-source voltage of the transistor device has dropped by a predetermined amount or to a predetermined level, and wherein the transistor device is a Gallium Nitride, GaN, transistor.

7. The circuit according to claim 1,
wherein the control circuit is further adapted to apply a fourth voltage level to the gate of the transistor device, wherein the first, second, third, and fourth voltage levels are distinct voltage levels.

8. The circuit according to claim 7,
wherein the third and fourth voltage levels are intermediate voltage levels between the first and second voltage levels.

9. The circuit according to claim 7,
wherein the fourth voltage level is chosen such that the transistor device operates within its safe operation area, SOA, at a given drain-source voltage of the transistor device, when the fourth voltage level is applied to the gate of the transistor device.

10. The circuit according to claim 1, wherein the control circuit comprises:
a first switch coupled between the first voltage level and the gate of the transistor device;
a second switch coupled between the second voltage level and the gate of the transistor device; and
a third switch coupled between the third voltage level and the gate of the transistor device; and
wherein the control circuit is adapted to switch any one of the first, second, and third switches to an on-state, while keeping the other switches in an off-state.

11. The circuit according to claim 7, wherein the control circuit comprises:
a first switch coupled between the first voltage level and the gate of the transistor device;
a second switch coupled between the second voltage level and the gate of the transistor device;
a third switch coupled between the third voltage level and the gate of the transistor device; and
a fourth switch coupled between the fourth voltage level and the gate of the transistor device; and
wherein the control circuit is adapted to switch any one of the first, second, third, and fourth switches to an on-state, while keeping the other switches in an off-state.

12. The circuit according to claim 1, wherein the control circuit is adapted to:
apply the first, second, and third voltage levels such that a gate voltage of the transistor device changes from the first voltage level to the third voltage level and from the third voltage level to the second voltage level; and
apply the second voltage level a predetermined period of time after the third voltage level has been applied.

13. The circuit according to claim 1, wherein the transistor device is a Gallium Nitride, GaN, transistor or a Metal Oxide Semiconductor, MOS, transistor.

14. A method of operating a transistor device that acts as a switch, the method comprising the steps of:
selectively applying at least a first voltage level, a second voltage level, and a third voltage level to a gate of the transistor device, wherein the first, second, and third voltage levels are distinct voltage levels, wherein the first voltage level is chosen such that a gate-source voltage of the transistor device is substantially zero or negative when the first voltage level is applied to the gate of the transistor device;

wherein the second voltage level is chosen such that the transistor device is fully conducting when the second voltage level is applied to the gate of the transistor device; and wherein the third voltage level is chosen such that the gate-source voltage of the transistor device is smaller than a threshold voltage of the transistor device, when the third voltage level is applied to the gate of the transistor device, wherein the threshold voltage is turn-on threshold voltage for the gate-source voltage at which the transistor device starts conducting.

15. The method according to claim 14, wherein the third voltage level is an intermediate voltage level between the first and second voltage levels.

16. The method according to claim 14, wherein the third voltage level is chosen such that the gate-source voltage of the transistor device is smaller than the threshold voltage of the transistor device by a predetermined amount, when the third voltage level is applied to the gate of the transistor device.

17. The method according to claim 14, wherein the third voltage level is chosen such that the transistor device operates within its safe operation area, SOA, at a given drain-source voltage of the transistor device, when the third voltage level is applied to the gate of the transistor device.

18. The method according to claim 17, wherein the third voltage level is chosen between the first and second voltage levels such that the gate-source voltage of the transistor device is larger than the threshold voltage of the transistor device, when the third voltage level is applied to the gate of the transistor device.

19. The method according to claim 14, further comprising the steps of:
applying the first, second, and third voltage levels such that a gate voltage of the transistor device changes from the first voltage level to the third voltage level and from the third voltage level to the second voltage level; and
applying the second voltage level when, after the third voltage level has been applied, a drain-source voltage of the transistor device has dropped by a predetermined amount or to a predetermined level.

20. The method according to claim 14, further comprising the step of:
applying a fourth voltage level to the gate of the transistor device,
wherein the first, second, third, and fourth voltage levels are distinct voltage levels.

21. The method according to claim 20,
wherein the third and fourth voltage levels are intermediate voltage levels between the first and second voltage levels.

22. The method according to claim 20,
wherein the fourth voltage level is chosen such that the transistor device operates within its safe operation area, SOA, at a given drain-source voltage of the transistor device, when the fourth voltage level is applied to the gate of the transistor device.

23. The method according to claim 14, further comprising the steps of:
providing a first switch coupled between the first voltage level and the gate of the transistor device;
providing a second switch coupled between the second voltage level and the gate of the transistor device;

providing a third switch coupled between the third voltage level and the gate of the transistor device; and switching any one of the first, second, and third switches to an on-state, while keeping the other switches in an off-state.

24. The method according to claim 20, further comprising the steps of:

providing a first switch coupled between the first voltage level and the gate of the transistor device;

providing a second switch coupled between the second voltage level and the gate of the transistor device;

providing a third switch coupled between the third voltage level and the gate of the transistor device;

providing a fourth switch coupled between the fourth voltage level and the gate of the transistor device; and switching any one of the first, second, third, and fourth switches to an on-state, while keeping the other switches in an off-state.

25. The method according to claim 14, further comprising the steps of:

applying the first, second, and third voltage levels such that a gate voltage of the transistor device changes from the first voltage level to the third voltage level and from the third voltage level to the second voltage level; and applying the second voltage level a predetermined period of time after the third voltage level has been applied.

26. The method according to claim 14, wherein the transistor device is a Gallium Nitride, GaN, transistor or a Metal Oxide Semiconductor, MOS, transistor.

\* \* \* \* \*